United States Patent
Yu et al.

(10) Patent No.: US 11,303,113 B2
(45) Date of Patent: Apr. 12, 2022

(54) SHUTDOWN CONTROL SYSTEM AND METHOD

(71) Applicant: SUNGROW POWER SUPPLY CO., LTD., Anhui (CN)

(72) Inventors: Yanfei Yu, Anhui (CN); Hua Ni, Anhui (CN); Zongjun Yang, Anhui (CN)

(73) Assignee: SUNGROW POWER SUPPLY CO., LTD., Anhui (CN)

( * ) Notice: Subject to any disclaimer, the term of this patent is extended or adjusted under 35 U.S.C. 154(b) by 380 days.

(21) Appl. No.: 16/579,600

(22) Filed: Sep. 23, 2019

(65) Prior Publication Data
US 2020/0106264 A1    Apr. 2, 2020

(30) Foreign Application Priority Data

Sep. 28, 2018 (CN) .......................... 201811142836.X

(51) Int. Cl.
*H02H 9/04*    (2006.01)
*H02S 40/32*    (2014.01)
(Continued)

(52) U.S. Cl.
CPC .............. *H02H 9/04* (2013.01); *H02H 7/20* (2013.01); *H02S 40/32* (2014.12); *H02S 40/34* (2014.12)

(58) Field of Classification Search
CPC .. H02H 9/04; H02H 7/20; H02H 5/12; H02H 1/0061; H02S 40/32; H02S 40/34;
(Continued)

(56) References Cited

U.S. PATENT DOCUMENTS

| | | | | |
|---|---|---|---|---|
| 10,819,104 | B2* | 10/2020 | Braginsky | H02H 7/20 |
| 2014/0265638 | A1* | 9/2014 | Orr | H02J 3/40 |
| | | | | 307/131 |
| 2018/0366945 | A1* | 12/2018 | Braginsky | H02J 3/381 |

FOREIGN PATENT DOCUMENTS

| | | |
|---|---|---|
| CN | 206790098 U | 12/2017 |
| CN | 108270398 A | 7/2018 |
| WO | WO-2015001775 A1 | 1/2015 |

OTHER PUBLICATIONS

EP 3540938; Macerini sauro; A Shut down apparatus for a string of photovoltaic panels; Publication date: Sep. 18, 2019 (Year: 2019).*

(Continued)

*Primary Examiner* — Dharti H Patel
(74) *Attorney, Agent, or Firm* — Harness, Dickey & Pierce, P.L.C.

(57) ABSTRACT

A shutdown control system and a shutdown control method are provided. A main circuit is a series circuit formed by connecting output ends of multiple shutdown circuits in series or a series-parallel circuit formed by connecting output ends of multiple such series circuits in parallel. Each of the multiple shutdown circuits is connected to at least one of direct current power supplies in a distributed power generation system. A control circuit includes a SCU, one or more ACUs, and multiple PCUs corresponding to the multiple shutdown circuits. The SCU and the ACU are configured to transmit respective mode control instructions when respective condition is satisfied. Each of the multiple PCUs is configured to obtain multiple criteria based on the mode control instructions, determine a target operation mode of a corresponding shutdown circuit, and control the shutdown circuit to operate in the target operation mode.

11 Claims, 2 Drawing Sheets

(51) Int. Cl.
*H02S 40/34* (2014.01)
*H02H 7/20* (2006.01)
(58) Field of Classification Search
CPC .... Y02E 10/56; H01L 31/02021; H02J 3/381; H02J 3/383; H02J 13/0013
USPC ...................................................... 361/91.1
See application file for complete search history.

(56) References Cited

OTHER PUBLICATIONS

First Chinese Office Action regarding Application No. 201811142836.X dated Feb. 28, 2020. English translation provided by Unitalen Attorneys at Law.
U.S. National Electrical Code, 2017 Edition, National Fire Protection Association, Quincy, MA; 2016.
MODBUS Application Protocol Specification, www.modbus.org; May 2002.

\* cited by examiner

SHUTDOWN CONTROL SYSTEM AND METHOD

The present application claims priority to Chinese Patent Application No. 201811142836.X, titled "SHUTDOWN CONTROL SYSTEM AND METHOD", filed on Sep. 28, 2018 with the Chinese Patent Office, which is incorporated herein by reference in its entirety.

FIELD

The present disclosure relates to the technical field of electrical shock protection, and in particular to a shutdown control system and a shutdown control method.

BACKGROUND

In a distributed power generation system, a single direct current power supply cannot supply enough voltage and power to meet actual demand. Therefore, multiple direct current power supplies are connected in series-parallel to meet design needs. However, since the multiple direct current power supplies are connected in series-parallel, a total output voltage value may be up to hundreds or thousands of volts. When a worker is close to the distributed power generation system, a severe electric shock accident may occur.

In an existing solution of electrical shock protection, a shutdown circuit is arranged on each of the multiple direct current power supplies. When the worker is close to the distributed power generation system, a host device is manually triggered to transmit a shutdown instruction, so as to control the shutdown circuit on each of the multiple direct current power supplies to turn off the direct current power supply, such that the total output voltage of the multiple direct current power supplies connected in series-parallel fall within a security voltage range. However, a fault may occur in a communication link of this solution in practices. For example, a communication signal may be absorbed or blocked. As a result, some shutdown circuits cannot receive the shutdown instruction, thereby failing to turn off the direct current power supply. In view of the above, the following improvements are made to this solution. The host device further transmits a heartbeat signal to each shutdown circuit. Once a shutdown circuit does not receive the heartbeat signal from the host device, it knows that the communication link is broken, and then turns off the corresponding direct current power supply directly.

In the improved solution, the direct current power supply is turned off each time when a fault occurs in any one of the host device and the communication link. However, this improved solution has a problem that, when a temporary or random abnormal condition occurs multiple times in any one of the host device and the communication link, the direct current power supply may be frequently turned off, which severely affects the usability of the distributed power generation system.

SUMMARY

In view of this, a shutdown control system and a shutdown control method are provided in the present disclosure, to improve the usability of a distributed power generation system having a function of electrical shock protection.

The shutdown control system includes a main circuit and a control circuit.

The main circuit is a series circuit formed by connecting output ends of multiple shutdown circuits in series. Alternatively, the main circuit is a series-parallel circuit formed by connecting output ends of multiple shutdown circuits in series to form a series circuit and connecting output ends of multiple such series circuits in parallel. An input end of each of the multiple shutdown circuits is connected to at least one of direct current power supplies in a distributed power generation system.

The control circuit includes a system control unit (SCU), one or more auxiliary control units (ACU), and multiple power source control units (PCU) corresponding to the multiple shutdown circuits. The SCU is configured to transmit a first mode control instruction when a first condition is satisfied, and each of the ACUs is configured to transmit a second mode control instruction when a second condition is satisfied. Each of the multiple PCUs is configured to obtain multiple criteria based on the first mode control instruction and the second mode control instruction, determine a target operation mode of a shutdown circuit corresponding to the PCU based on the multiple criteria, and control the shutdown circuit corresponding to the PCU to operate in the target operation mode.

The target operation mode includes a security mode and a normal operation mode. In the security mode, an output voltage of the shutdown circuit corresponding to the PCU is limited to control an output voltage of the series circuit to be in a security voltage range. The normal operation mode is a mode other than the security mode.

In an embodiment, the SCU is configured to periodically transmit a first communication signal as the first mode control instruction, and stop transmitting the first communication signal when receiving a first user command.

Each of the ACUs is configured to periodically transmit a second communication signal as the second mode control instruction while detecting that the SCU periodically transmits the first communication signal. The ACU stops transmitting the second communication signal when detecting that the SCU stops transmitting the first communication signal.

Accordingly, each of the multiple PCUs is configured to determine whether the PCU receives one of the first communication signal from the SCU and the second communication signal from the ACUs during a preset time period. If it is determined that the PCU receives one of the first communication signal from the SCU and the second communication signal from the ACUs during the preset time period, the PCU is configured to control the shutdown circuit corresponding to the PCU to operate in the normal operation mode. If it is determined that the PCU does not receive any one of the first communication signal transmitted from the SCU and the second communication signal transmitted from the ACUs during the preset time period, the PCU is configured to control the shutdown circuit corresponding to the PCU to operate in the security mode.

In an embodiment, each of the first communication signal and the second communication signal is a communication signal including an instruction indicating the normal operation mode.

The SCU is further configured to periodically transmit a communication signal including an instruction indicating the security mode in response to the first user command.

Each of the ACUs is further configured to periodically transmit a communication signal including an instruction indicating the security mode after detecting that the SCU stops transmitting the first communication signal.

In an embodiment, the SCU is configured to transmit a communication signal including an instruction indicating the normal operation mode in response to a second user command, and transmit the communication signal including an instruction indicating the security mode in response to a first user command. Each of the communication signal including an instruction indicating the normal operation mode and the communication signal including an instruction indicating the security mode functions as the first mode control instruction.

Each of the ACUs is configured to transmit a communication signal including an instruction indicating the normal operation mode or an instruction indicating the security mode following the SCU.

Accordingly, each of the multiple PCUs is configured to control the shutdown circuit corresponding to the PCU to operate in the normal operation mode when receiving the communication signal including an instruction indicating the normal operation mode transmitted from one of the SCU and the ACUs, and control the shutdown circuit corresponding to the PCU to operate in the security mode when receiving the communication signal including an instruction indicating the security mode transmitted from one of the SCU and the ACUs.

In an embodiment, the SCU is configured to periodically transmit a first communication signal as the first mode control instruction. The SCU stops transmitting the first communication signal when receiving a first user command.

Each of the ACUs is configured to periodically transmit a communication signal including an instruction indicating the normal operation mode while detecting that the SCU periodically transmits the first communication signal, and periodically transmit a communication signal including an instruction indicating the security mode when it is detected that the SCU stops transmitting the first communication signal. Each of the communication signal including the instruction indicating the normal operation mode and the communication signal including the instruction indicating the security mode functions as the second mode control instruction.

Accordingly, each of the multiple PCUs is configured to control the shutdown circuit corresponding to the PCU to operate in the security mode if one of a third condition and a fourth condition is satisfied, and control the shutdown circuit corresponding to the PCU to operate in the normal operation mode if none of the third condition and the fourth condition is satisfied. The third condition is that the PCU receives neither the first communication signal from the SCU nor the communication signal including an instruction indicating the normal operation mode from the ACUs during a preset time period. The fourth condition is that the PCU receives the communication signal including an instruction indicating the security mode from the ACUs.

In an embodiment, in the shutdown control system, each of the ACUs is integrated into one of the plurality of PCUs, and each of the plurality of PCUs is integrated with one of the ACUs.

In an embodiment, the SCU is configured to periodically transmit a first communication signal as the first mode control instruction. The SCU stops transmitting the first communication signal when receiving a first user command.

At least one of the ACUs is configured to take over from the SCU when detecting that a failure occurs in the SCU.

Accordingly, each of the multiple PCUs is configured to determine whether the PCU receives the first communication signal from one of the SCU and the ACUs during a preset time period. If it is determined that the PCU receives the first communication signal from one of the SCU and the ACUs during the preset time period, the PCU is configured to control the shutdown circuit corresponding to the PCU to operate in the normal operation mode. If it is determined that the PCU does not receive the first communication signal from any one of the SCU and the ACUs during the preset time period, the PCU is configured to control the shutdown circuit corresponding to the PCU to operate in the security mode.

In an embodiment, the SCU is configured to transmit a communication signal including an instruction indicating the normal operation mode in response to a second user command, and transmit a communication signal including an instruction indicating the security mode in response to a first user command. Each of the communication signal including an instruction indicating the normal operation mode and the communication signal including an instruction indicating the security mode functions as the first mode control instruction.

At least one of the ACUs is configured to take over from the SCU when detecting that a failure occurs in the SCU.

Accordingly, each of the multiple PCUs is configured to control the shutdown circuit corresponding to the PCU to operate in the normal operation mode when receiving the communication signal including the instruction indicating the normal operation mode transmitted from one of the SCU and the ACUs, and control the shutdown circuit corresponding to the PCU to operate in the security mode when receiving the communication signal including the instruction indicating the security mode transmitted from one of the SCU and the ACUs.

In an embodiment, the SCU is configured to periodically transmit a first communication signal as the first mode control instruction. The SCU stops transmitting the first communication signal when receiving a first user command.

Each of the ACUs is configured to periodically transmit the second communication signal. The ACU stops transmitting the second communication signal when receiving the first user command.

Accordingly, each of the multiple PCUs is configured to determine whether the PCU receives one of the first communication signal and the second communication signal during a preset time period. If it is determined that the PCU receives one of the first communication signal and the second communication signal during the preset time period, the PCU is configured to control the shutdown circuit corresponding to the PCU to operate in the normal operation mode. If it is determined that the PCU does not receive any one of the first communication signal and the second communication signal during the preset time period, the PCU is configured to control the shutdown circuit corresponding to the PCU to operate in the security mode.

In an embodiment, the SCU is configured to transmit a communication signal including an instruction indicating the normal operation mode as the first mode control instruction in response to a second user command, and transmit a communication signal including an instruction indicating the security mode as the first mode control instruction in response to a first user command.

Each of the ACUs is configured to transmit a communication signal including an instruction indicating the normal operation mode as the second mode control instruction in response to the second user command, and transmit a communication signal including an instruction indicating the security mode as the second mode control instruction in response to the first user command.

Accordingly, each of the multiple PCUs is configured to control the shutdown circuit corresponding to the PCU to operate in the normal operation mode when receiving the communication signal including an instruction indicating the normal operation mode transmitted from one of the SCU and the ACUs, and control the shutdown circuit corresponding to the PCU to operate in the security mode when receiving the communication signal including an instruction indicating the security mode transmitted from one of the SCU and the ACUs.

A shutdown control method applied to a shutdown control system is provided. The shutdown control system includes a main circuit and a control circuit. The main circuit is a series circuit formed by connecting output ends of multiple shutdown circuits in series. Alternatively, the main circuit is a series-parallel circuit formed by connecting output ends of multiple shutdown circuits in series to form a series circuit and connecting output ends of multiple such series circuits in parallel. An input end of each of the multiple shutdown circuits is connected to at least one of direct current power supplies in a distributed power generation system.

The control circuit includes a system control unit (SCU), one or more auxiliary control units (ACUs), and multiple power source control units (PCU) corresponding to the plurality of shutdown circuits.

The shutdown control method includes: transmitting, by the SCU, a first mode control instruction when a first condition is satisfied, transmitting, by each of the ACUs, a second mode control instruction when a second condition is satisfied; and obtaining, by each of the multiple PCUs, multiple criteria based on the first mode control instruction and the second mode control instruction, determining, by the PCU, a target operation mode of a shutdown circuit corresponding to the PCU based on the multiple criteria, and controlling, by the PCU, the shutdown circuit corresponding to the PCU to operate in the target operation mode.

The target operation mode includes a security mode and a normal operation mode. In the security mode, an output voltage of the shutdown circuit corresponding to the PCU is limited to control an output voltage of the series circuit to be in a security voltage range. The normal operation mode is a mode other than the security mode.

It can be seen from the above technical solutions, each of the multiple PCUs can determine the target operation mode of the shutdown circuit corresponding to the PCU based on not only the first mode control instruction transmitted from the SCU but also a second mode control instruction transmitted from the ACU, and control the shutdown circuit corresponding to the PCU to operate based on the determination result. Even if the PCU cannot receive a mode control instruction transmitted from one of the SCU and the ACU due to a fault occurring in the electrical shock protection, the PCU can still determine correctly based on the mode control instruction transmitted from the other of the SCU and the ACU, so as to prevent the shutdown circuit from operating in a wrong mode when the PCU does not receive a mode control instruction transmitted from one of the SCU and the ACU, thereby avoid the effect on the usability of the distributed power generation system due to the failure of receiving a control instruction from a single source.

BRIEF DESCRIPTION OF THE DRAWINGS

In order to more clearly illustrate technical solutions in embodiments of the present disclosure or in the conventional technology, the drawings to be used in the description of the embodiments or the conventional technology are briefly described below. Apparently, the drawings in the following description show only some embodiments of the present disclosure, and other drawings may be obtained by those skilled in the art from the drawings without any creative work.

DETAILED DESCRIPTION OF EMBODIMENTS

Hereinafter, technical solutions in the embodiments of the present disclosure are clearly and completely described with reference to the drawings in the embodiments of the present disclosure. It is apparent that the embodiments described herein are only part of embodiments of the present disclosure. Based on the embodiments of the present disclosure, all of other embodiments obtained by those skilled in the art without any creative work should fall within the scope of protection of the present disclosure.

Figure 1:
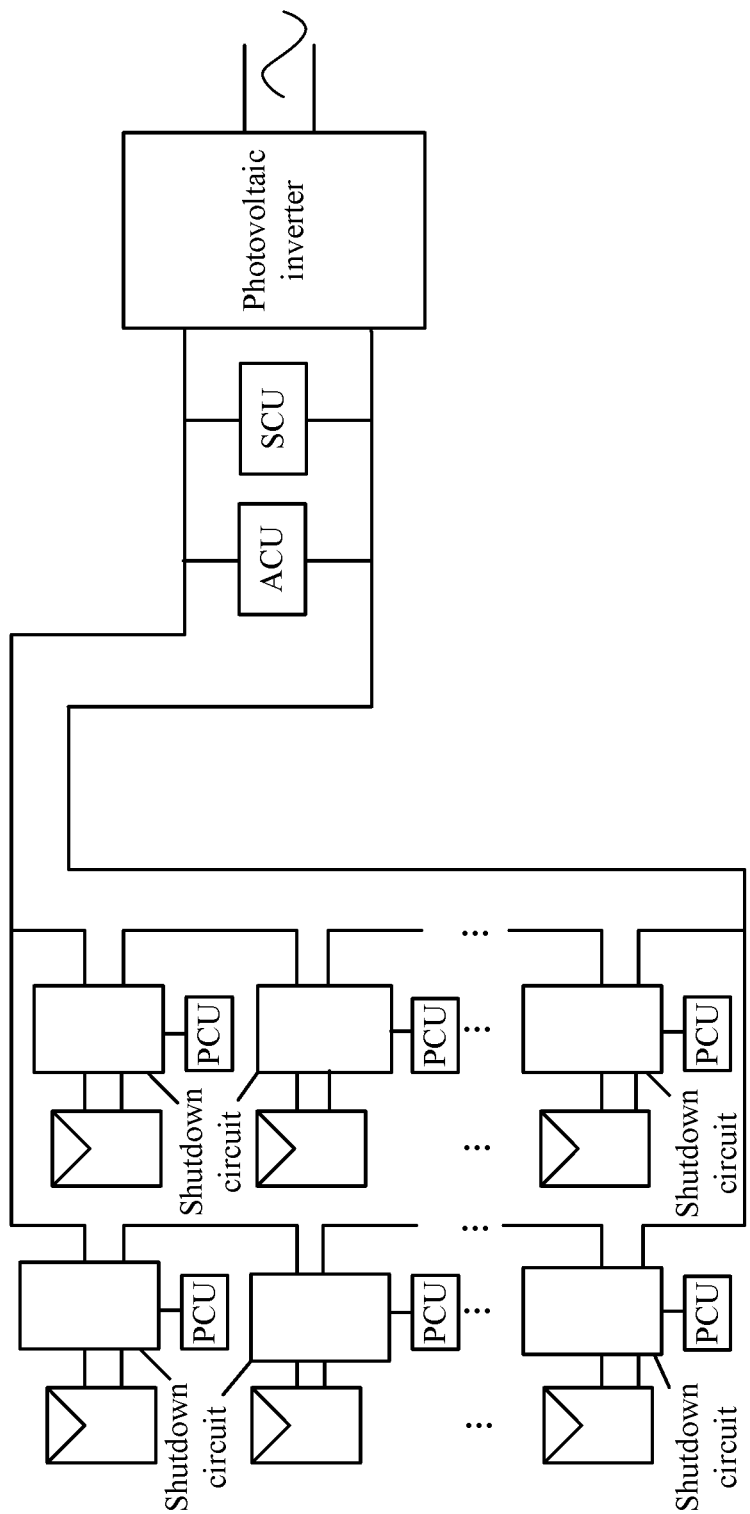
FIG. 1 is a schematic structural diagram of a shutdown control system according to an embodiment of the present disclosure.

Referring to FIG. 1, a shutdown control system is provided according to an embodiment of the present disclosure. A main circuit of the shutdown control system is a series circuit formed by connecting output ends of multiple shutdown circuits in series. Alternatively, the main circuit of the shutdown control system is a series-parallel circuit formed by connecting output ends of multiple shutdown circuits in series to form a series circuit, and connecting output ends of multiple such series circuits in parallel. An input end of each of the multiple shutdown circuits is connected to at least one of direct current power supplies in a distributed power generation system. In a case that an input end of any one of the multiple shutdown circuits is connected to multiple direct current power supplies, the multiple direct current power supplies may be connected in series, parallel or series-parallel. It can be seen from the above, each of the direct current power supplies in the distributed power generation system is provided with a shutdown circuit. Any one of the shutdown circuits may be provided to one direct current power supply, or may be shared by multiple direct current power supplies.

The shutdown control system may be applied to a distributed power generation system using photovoltaic modules as direct current power supplies (hereinafter refer to as photovoltaic system). The shutdown control system may also be applied to a distributed power generation system using storage batteries, super capacitors or fuel batteries as the direct current power supplies, which is not limited herein. In an example shown in FIG. 1, the shutdown control system is applied to the photovoltaic system including two series circuits, and each of the photovoltaic modules is provided with one shutdown circuit separately.

Still referring to FIG. 1, a control circuit of the shutdown control system includes a system control unit (SCU), one or more auxiliary control units (ACU), and multiple power source control units (PCU) corresponding to the multiple shutdown circuits. The multiple shutdown circuits and the multiple PCUs may be provided in a one-to-one correspondence. Alternatively, two or more of the multiple shutdown circuits may share one PCU. The SCU is configured to transmit a first mode control instruction when a first condition is satisfied, and the ACU is configured to transmit a second mode control instruction when a second condition is satisfied. Each of the multiple PCUs is configured to obtain multiple criteria based on the first and second mode control instructions, determine a target operation mode of a shutdown circuit corresponding to the PCU based on the multiple criteria, and control the shutdown circuit corresponding to the PCU to operate in the target operation mode.

The target operation mode includes a security mode and a normal operation mode. The security mode and the normal operation mode of the shutdown circuit are defined based on whether the shutdown circuit performs electrical shock protection. The normal operation mode is a mode other than the security mode.

In some embodiments, in the normal operation mode, the distributed power generation system is controlled to normally operate as required without regarding a risk of electric shock. For example, the distributed power generation system operates at maximum power or limited power or is on standby based on the practical conditions.

In the security mode, an output voltage of the shutdown circuit corresponding to the PCU is limited, such that an output voltage (hereinafter refer to as string voltage) of the series circuit falls within a security voltage range, so as to avoid an electric shock accident when a worker is closed to the distributed power generation system. The limited value of the output voltage of the shutdown circuit is determined based on actual conditions. For example, according to the US NEC 2017, a photovoltaic system mounted on a building is required to have a rapid shutdown function, and after the photovoltaic system is turned off, a voltage of an electric conductor located beyond a distance of 0.3 m from the photovoltaic system should not exceed a value of 30V. In this case, for a series circuit formed by connecting 22 shutdown circuits in series, each of the shutdown circuits may operate in a security mode in which an output voltage of the shutdown circuit is less than 1V, such that the string voltage does not exceed a value of 22V, satisfying the security requirement of 30V.

It can be seen from the above, each of the multiple PCUs can determine the target operation mode of the shutdown circuit corresponding to the PCU based on not only the first mode control instruction transmitted from the SCU but also the second mode control instruction transmitted from the ACU, and control the shutdown circuit corresponding to the PCU to operate based on the determination result. Even if the PCU cannot receive a mode control instruction transmitted from one of the SCU and the ACU due to a fault occurring in the electrical shock protection system, the PCU can still determine correctly based on the mode control instruction transmitted from the other of the SCU and the ACU, so as to prevent the shutdown circuit from operating in a wrong mode when the PCU does not receive a mode control instruction transmitted from one of the SCU and the ACU, thereby avoiding the effect on the usability of the distributed power generation system due to the failure of receiving a control instruction from a single source.

In embodiments of the present disclosure, the PCU controlling the shutdown circuit to operate in the security mode may be that the PCU controls the shutdown circuit to operate in a security mode in which the output voltage value of the shutdown circuit is equal to zero, or the PCU controls the shutdown circuit to operate in a security mode in which the output voltage value of the shutdown circuit is not equal to zero, which are described in detail below.

The shutdown circuit being controlled to operate in a security mode in which the output voltage value of the shutdown circuit is equal to zero may be implemented by at least the following three methods. In a first method, a voltage value of an input end of the shutdown circuit is controlled to be equal to an open circuit voltage value of a direct current power supply connected to the input end of the shutdown circuit. In this case, an output current value of the direct current power supply connected to the input end of the shutdown circuit is equal to zero, and thus there is no power transmitted to an output end of the shutdown circuit, thereby avoiding the electric shock accident. In a second method, a current value of the input end of the shutdown circuit is controlled to be equal to a short circuit current value of the direct current power supply connected to the input end of the shutdown circuit. In this case, the voltage value of the input end of the shutdown circuit is equal to zero, and thus there is no power transmitted to the output end of the shutdown circuit, thereby avoiding the electric shock accident. In a third method, the input end of the shutdown circuit is disconnected from the output end of the shutdown circuit, or the shutdown circuit is controlled to be turned off.

The shutdown circuit being controlled to operate in a security mode in which the output voltage value of the shutdown circuit is not equal to zero may be implemented at least by the following two methods. In a first method, the voltage value of the input end (or the output end) of the shutdown circuit is controlled to be kept at a preset value not equal to zero. In a second method, the voltage value of the input end (or the output end) of the shutdown circuit is controlled to periodically change in a preset range.

It should be noted that, the security modes of the multiple shutdown circuits in a same shutdown control system may be implemented by different methods or by a same method, which is not limited herein. Normally, the PCU is powered by a direct current power supply on a front end of the corresponding shutdown circuit. In a case that the direct current power supply cannot supply power to the PCU (for example, in a case that the current value of the input end of the shutdown circuit is controlled to be equal to the short circuit current value of the direct current power supply connected to the input end of the shutdown circuit), the PCU may be powered by another direct current power supply that is not short-circuited or by an additional storage battery.

A topology of the shutdown circuit is described below. The shutdown circuit includes a switching device. The switching device is configured to switch between the operation modes of the shutdown circuit.

Figure 2:
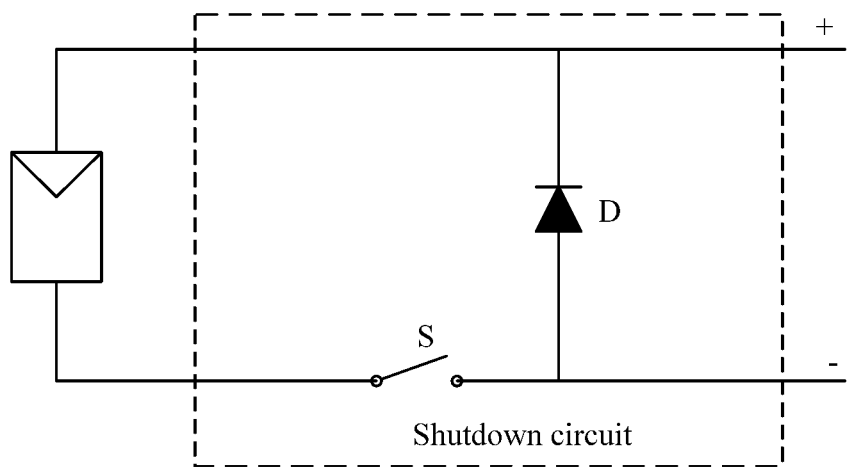
FIG. 2 is a schematic structural diagram of a shutdown circuit according to an embodiment of the present disclosure.

For example, in the topology shown in FIG. 2, a shutdown circuit includes a switch S and a diode D. The switch S is connected between an input end and an output end of the shutdown circuit. The diode D is connected to the output end of the shutdown circuit in inverse-parallel. The operation principle of the shutdown circuit is described as follows. When the switch S is turned on, the input end is connected to the output end of the shutdown circuit, such that the shutdown circuit operates in the normal operation mode. When the switch S is turned off, a current loop between the input end and the output end of the shutdown circuit is cut off, such that the shutdown circuit operates in the security mode in which an output voltage value of the shutdown circuit is equal to zero. Alternatively, the switch S is turned on and off alternately (for example, in a pulse width modulation (PWM) manner with a fixed duty cycle or in a hysteresis comparing PWM manner), to alternately connect and disconnect the input end and the output end of the shutdown circuit, so as to output a smooth waveform in cooperation with an inductor and a capacitor (or a parasitic capacitance and a parasitic inductance), such that a voltage value of the output end of the shutdown circuit is kept at a preset value. The diode D is configured to provide a bypass path for a current of a series circuit when the switch S is turned off.

Alternatively, the switch S may be connected to the input end or the output end of the shutdown circuit in parallel. When the switch S is turned off, the shutdown circuit operates in the normal operation mode. When the switch S is turned on, the voltage value of the output end of the shutdown circuit is reduced to zero. Alternatively, the switch S is turned on and off alternately, such that the voltage value of the output end of the shutdown circuit is kept at a preset value.

Alternatively, the shutdown circuit may also be a direct current/direct current (DC/DC) converter, such as a buck converter, a boost converter, or a buck-boost converter. The DC/DC converter may be switched to the normal operation mode or the security mode by controlling a state of a switch in the DC/DC converter.

The SCU and the ACU may be physically separated devices, as shown in FIG. 1. Alternatively, the SCU and/or the ACU may be integrated in an existing device of the distributed power generation system to improve integration level of the distributed power generation system and reduce cost. For example, the ACU is integrated in a photovoltaic inverter.

The PCU includes a receiver and a controller. The receiver is configured to receive signals transmitted from the SCU and the ACU, and transmit the signals to the controller. The controller is configured to analyze and process the received signals. For example, the controller analyzes a received mode control instruction, to determine whether to control the shutdown circuit to operate in the normal operation mode or the security mode, and generates a control signal to control the operation of the shutdown circuit. In some embodiments, the PCU further includes a transmitter. The controller transmits a communication signal via the transmitter. In this case, the PCU generally has a unique device identifier (ID). In a case that the controller identifies a mode control instruction including the ID of the PCU and requiring a response communication signal, among mode control instructions received by the receiver, the transmitter transmits a response communication signal. Generally, the response communication signal also includes the ID of the PCU. In order to improve the integration level of the distributed power generation system and reduce the cost, the transmitter and the receiver in a same PCU may share a part of circuit, and multiple shutdown circuits may be controlled by a same PCU.

In any one of the embodiments disclosed above, the control circuit may have one of at least the following seven control logics.

First Control Logic

In a first control logic, the SCU is configured to periodically transmit a first communication signal as the first mode control instruction until receiving a first user command. The first user command is a command to start performing the electrical shock protection function of the shutdown control system, i.e., a command used to control the shutdown circuit to operate in the security mode (which is defined in the same way in the following control logics).

The ACU is configured to periodically transmit a second communication signal as the second mode control instruction while detecting that the SCU periodically transmits the first communication signal. The ACU stops transmitting the second communication signal when detecting that the SCU stops transmitting the first communication signal.

Accordingly, each of the multiple PCUs is configured to determine whether the PCU receives one of the first communication signal from the SCU and the second communication signal transmitted from any one of ACUs during a preset time period T1. Whether the PCU receives the first communication signal transmitted from the SCU during the preset time period T1 functions as a first criterion, whether the PCU receives the second communication signal transmitted from a first ACU during the preset time period T1 functions as a second criterion, and whether the PCU receives the second communication signal transmitted from a second ACU during the preset time period T1 functions as a third criterion, and so forth. If it is determined that the PCU receives the first communication signal from the SCU or the second communication signal transmitted from any one of the ACUs during the preset time period T1, the PCU is configured to control the shutdown circuit corresponding to the PCU to operate in the normal operation mode. If it is determined that the PCU neither receives the first communication signal transmitted from the SCU nor receives the second communication signal transmitted from any one of the ACUs during the preset time period T1, the PCU is configured to control the shutdown circuit corresponding to the PCU to operate in the security mode.

In some embodiments, if the SCU has a transmission cycle of T2, and the ACU has a transmission cycle of T3, then T1>T2 and T1>T3. In this case, if the PCU communicates well with the SCU and the ACU, the PCU can receive the first communication signal and the second communication signal during the preset time period T1. If the PCU receives the communication signal transmitted from only one of the SCU and the ACU during the preset time period T1 due to poor communication, for example, if the PCU receives only the second communication signal transmitted from the ACU, the PCU can still control the shutdown circuit corresponding to the PCU to operate in a correct mode, rather than wrongly controlling the shutdown circuit corresponding to the PCU to operate in the security mode when failing to receive the first communication signal transmitted from the SCU, thereby improving the usability of the distributed power generation system.

In the first control logic, the ACU may use multiple criteria to determine that the SCU periodically transmits the first communication signal, referring to the following first and second examples.

In a first example, the ACU takes a fact of receiving the first communication signal periodically transmitted from the SCU as a criterion to determine that the SCU periodically transmits the first communication signal. That is, the first communication signal transmitted from the SCU not only functions as a first mode control instruction, but also is used to control the ACU to transmit the second communication signal.

For two devices A and B, if they use a same communication interval, data transmitted from the device A can be received and analyzed by the device B. For three devices A, B and C, if they use a same communication interval, communication collision may occur in a case that the device A and the device C simultaneously transmit data to the device B. Therefore, in a case that the control circuit includes multiple ACUs, and all of the PCUs and the multiple ACUs use a same communication interval, an anti-collision mechanism is required, so as to avoid the communication collision caused by multiple ACUs simultaneously transmitting signals in response to the signal transmitted from the SCU. For example, the ACUs transmitting signals at the same communication interval may have different IDs. The ID of the ACU may be an identification number prestored in a memory of the ACU at the factory, such as an identification number of 1706031234 including a date and a serial number. Alternatively, the ID of the ACU may be an identification number manually set when being used, such as an identification number inputted via a dip switch, a push button, a touch screen on the ACU or via a master computer for communication interaction. Alternatively, the ID of the ACU may be a communication address dynamically assigned based on a communication network, such as a communication address ranging from 001 to 255 dynamically assigned based on a Modbus protocol. IDs of all of the multiple ACUs are prestored in the SCU. The SCU transmits, to all of the ACUs, the first communication signal including an ID of one of the ACUs in an ID polling manner. Each of the ACUs analyzes information of the ID in the first communication signal after receiving the first communication signal, and compares the ID in the first communication signal with its own ID. If the ID in the first communication signal is identical to its own ID, the ACU transmits a second communication signal including its own ID. In this way, different ACUs may transmit the second communication signals at different time periods, such that each time only one ACU transmits the second communication signal, thereby avoiding the communication collision.

In the first example, only one communication interval is used in the control circuit. For example, the SCU, the ACU and the PCUs are coupled to a direct current power line and communicate to each other in a manner of power line carrier (PLC) communication. The way that each of the SCU and the ACU is connected between a positive end and a negative end of the direct current power line as shown in FIG. 1 is only an example. In practices, each of the SCU and the ACU may be coupled to the direct current power line via a current transformer.

In a second example, the ACU takes a fact of receiving a third communication signal periodically transmitted from the SCU while the SCU periodically transmits the first communication signal as a criterion to determine that the SCU periodically transmits the first communication signal. That is, the first communication signal transmitted from the SCU functions as the first mode control instruction, and the third communication signal transmitted from the SCU is used to control the ACU to transmit the second communication signal. A communication interval at which the SCU transmits the first communication signal may be identical or not identical to a communication interval at which the SCU transmits the third communication signal.

In the second example, in a case that the control circuit includes multiple ACUs, and all of the multiple ACUs and the PCUs use a same communication interval, the anti-collision mechanism is also required, so as to avoid the communication collision caused by the multiple ACUs simultaneously transmitting signals in response to the signal transmitted from the SCU. For example, the IDs of all of the multiple ACUs are prestored in the SCU. The SCU transmits, to all of the ACUs, the third communication signal including an ID of one of the ACUs in an ID polling manner. Each of the ACUs analyzes information of the ID in the third communication signal after receiving the third communication signal, and compares the ID in the third communication signal with its own ID. If the ID in the third communication signal is identical to its own ID, the ACU transmits the second communication signal including its own ID.

In some embodiments, in the first control logic, the second communication signal transmitted from the ACU may be received by the SCU. That is, the ACU responds to the SCU with the second communication signal after receiving the first communication signal transmitted from the SCU. The second communication signal may include data of the ACU or data of operation states of the distributed power generation system that are acquired by the ACU, such as a direct current bus voltage.

In addition, it should be noted that, in the first control logic, when the SCU stops transmitting the first communication signal, or the ACU stops transmitting the second communication signal, the SCU or the ACU may still transmit other communication signals, as long as the other communication signals are distinguished from the first communication signal and the second communication signal by, for example, instructions included in the communication signals. For example, each of the first communication signal and the second communication signal includes an instruction indicating the normal operation mode, while the other communication signal includes an instruction indicating the security mode. The SCU periodically transmits a communication signal including an instruction indicating the security mode in response to the first user command. The ACU periodically transmits a communication signal including an instruction indicating the security mode after it is detected that the SCU stops transmitting the first communication signal. The ACU may respond to the communication signal including an instruction indicating the security mode and an ID of the ACU that is transmitted by the SCU.

Second Control Logic

In a second control logic, the SCU is configured to transmit a communication signal including an instruction indicating the normal operation mode in response to a second user command and transmit a communication signal including an instruction indicating the security mode in response to the first user command. The second user command is used to control the shutdown circuit to operate in the normal operation mode (which is defined in the same way in the following control logics). Each of the communication signal including the instruction indicating the normal operation mode and the communication signal including the instruction indicating the security mode functions as the first mode control instruction.

The ACU is configured to transmit a communication signal including an instruction indicating the normal operation mode or an instruction indicating the security mode following the SCU.

Accordingly, each of the multiple PCUs is configured to control the shutdown circuit corresponding to the PCU to operate in the normal operation mode when receiving the communication signal including an instruction indicating the normal operation mode transmitted from one of the SCU and the ACU, and control the shutdown circuit corresponding to the PCU to operate in the security mode when receiving the communication signal including an instruction indicating the security mode transmitted from one of the SCU and the ACU.

Multiple communication links are provided in the second control logic, to prevent the shutdown circuit from wrongly operating in the security mode when the PCU fails to receive the communication signal including an instruction indicating the normal operation mode in a case that a single communication link is used and is disconnected due to poor communication, thereby improving the usability of the distributed power generation system.

The ACU may follows the SCU by transmitting the communication signal including an instruction indicating the normal operation mode when receiving the communication signal including an instruction indicating the normal operation mode transmitted from the SCU, and transmitting the communication signal including an instruction indicating the security mode when receiving the communication signal including an instruction indicating the security mode transmitted from the SCU. Alternatively, the ACU may follow the SCU according to other instructing information transmitted from the SCU, which is not limited herein.

In a case that the control circuit includes multiple ACUs, and all of the multiple ACUs and the PCUs use a same communication interval, the anti-collision mechanism is also required, so as to avoid the communication collision caused by the multiple ACUs simultaneously transmitting signals in response to the signal transmitted from the SCU. For example, the IDs of all of the multiple ACUs are prestored in the SCU. The SCU controls each of the multiple ACUs to transmit the communication signal in an ID polling manner.

Third Control Logic

In a third control logic, the SCU is configured to periodically transmit the first communication signal until receiving the first user command.

The ACU is configured to periodically transmit a communication signal including an instruction indicating the normal operation mode while detecting that the SCU periodically transmits the first communication signal, and periodically transmit a communication signal including an instruction indicating the security mode when detecting that the SCU stops transmitting the first communication signal.

Accordingly, each of the multiple PCUs is configured to control the shutdown circuit corresponding to the PCU to operate in the security mode if the PCU receives neither the first communication signal from the SCU nor the communication signal including an instruction indicating the normal operation mode from the ACU, or if the PCU receives the communication signal including an instruction indicating the security mode from the ACU during a preset time period. Otherwise, the PCU is configured to control the shutdown circuit corresponding to the PCU to operate in the normal operation mode.

Multiple communication links are provided in the third control logic, to prevent the shutdown circuit from wrongly operating in the security mode in a case that a single communication link is used and disconnected due to poor communication, thereby improving the usability of the distributed power generation system.

In the third control logic, the SCU may always transmit a fourth communication signal to the ACU when the SCU periodically transmits the first communication signal or stops transmitting the first communication signal. The communication signal including an instruction indicating the normal operation mode or an instruction indicating the security mode periodically transmitted from the ACU may also be received by the SCU. The communication signal may include data of the ACU or data of the operation states of the distributed power generation system acquired by the ACU, such as a direct current bus voltage, which are used to respond to the fourth communication signal.

In the first, second and third control logics, the ACU may function as a slave device of the SCU. In order to reduce cost of hardware, each ACU may be integrated into one PCU, and each PCU may be integrated with one ACU. For example, in the first control logic, each of the PCUs controls the shutdown circuit corresponding to the PCU to operate in the normal operation mode if receiving the first communication signal transmitted from the SCU or the second communication signal transmitted from any one of the PCUs. Otherwise, the PCU controls the shutdown circuit corresponding to the PCU to operate in the security mode.

Fourth Control Logic

In a fourth control logic, the SCU is configured to periodically transmit the first communication signal until receiving the first user command.

The ACU is configured to take over from the SCU when detecting that a failure occurs in the SCU.

Accordingly, each of the multiple PCUs is configured to determine whether the PCU receives the first communication signal from one of the SCU and the ACU during a preset time period T4. If it is determined that the PCU receives the first communication signal from the SCU or the ACU during the preset time period T4, the PCU is configured to control the shutdown circuit corresponding to the PCU to operate in the normal operation mode. If it is determined that the PCU does not receive the first communication signal from any one of the SCU and the ACU during the preset time period T4, the PCU is configured to control the shutdown circuit corresponding to the PCU to operate in the security mode.

In the fourth control logic, the shutdown control system includes only one ACU. The ACU functions as a standby host device to take over from the SCU when it is determined that a failure occurs in the SCU, preventing the shutdown circuit from wrongly operating in the security mode in a case that the failure occurs in the SCU, thereby improving the usability of the distributed power generation system. The ACU may detect the failure in the SCU by determining that the SCU does not transmit the first communication signal during the preset time period before the SCU receives the first user command.

It should be noted that, the ACU may delay taking over from the SCU by a time period t. For example, if the SCU transmits the first communication signal at a period of T in a normal state, there is a time interval of T2+t between a time instant at which the PCU receives the first communication signal from the SCU for the last time and a time instant at which the PCU receives the first communication signal from the ACU for the first time. Therefore, the preset time period T4 should be set to be longer than the time interval of T2+t.

Alternatively, the ACU may detect the failure in the SCU by a first detecting module provided in the ACU. The first detecting module is configured to detect an operation state of the SCU, and determine whether it is a requirement of the distributed power generation system or a failure in the SCU that causes the SCU to stop transmitting the communication signal. Only when the first detecting module detects that a failure occurs in the SCU, the ACU takes over from the SCU.

In an embodiment, the first detecting module of the ACU detects a failure in the SCU by detecting a state signal of a regularly flipping level outputted by the SCU. For example, in the normal operation mode, the SCU outputs at a port a state signal with a frequency of 1 Hz and a voltage flipping between 0V and 5V. In a case that a failure such as power-failure, chip crash or device damage occurs in the SCU, the level outputted at the port may stop flipping and become a fixed level with a voltage of 0V or 5V. The first detecting module of the ACU is connected to the port and monitors the port. When detecting that the state signal with a frequency of 1 Hz is not outputted via the port, it may be determined that a failure occurs in the SCU.

In another embodiment, the first detecting module of the ACU detects a failure in the SCU by detecting whether dedicated communication between the ACU and the SCU is normal. For example, the first detecting module is a communication module of the ACU for transmitting and receiving the dedicated communication. The ACU transmits a dedicated communication signal to the SCU, and determines whether a response communication signal from the SCU is received. If the ACU does not receive the response communication signal from the SCU, it is determined that a failure occurs in the SCU. The dedicated communication is performed at a communication interval different from the communication interval at which the ACU transmits the communication signal to the PCU.

In other embodiments, the first detecting module of the ACU detects a failure in the SCU by detecting whether a voltage of an input port or an output port of the SCU is normal, or whether temperature in the SCU is normal or the like, which are not described in detail herein.

In an embodiment, the ACU further includes a state indicating module. In a case that a failure in the SCU is detected, the state indicating module may output a warning signal to indicate the failure in the SCU and inform a worker to examine and repair. The state indicating module may output the warning signal in a form of a sound signal, an optical signal, an electrical signal, a communication signal or the like, which is not limited herein.

Fifth Control Logic

In a fifth control logic, the SCU is configured to transmit a communication signal including an instruction indicating the normal operation mode in response to a second user command, and transmit a communication signal including an instruction indicating the security mode in response to a first user command.

The ACU is configured to take over from the SCU when it is determined that a failure occurs in the SCU.

Accordingly, each of the multiple PCUs is configured to control the shutdown circuit corresponding to the PCU to operate in the normal operation mode when receiving the communication signal including the instruction indicating the normal operation mode transmitted from one of the SCU and the ACU, and control the shutdown circuit corresponding to the PCU to operate in the security mode when receiving the communication signal including the instruction indicating the security mode transmitted from one of the SCU and the ACU.

The ACU may be provided with a first detecting module to detect the operation state of the SCU, referring to the fourth control logic for details. In the fifth control logic, the shutdown control system includes only one ACU. The ACU functions as the standby host device of the SCU. In the fifth control logic, it is avoided that the shutdown circuit cannot operate in the normal operation mode when the SCU fails to respond to the second user command due to a failure in the SCU, thereby improving the usability of the distributed power generation system.

In an embodiment, the ACU may be provided with a second detecting module to detect an operation state of the distributed power generation system. After taking over from the SCU, the ACU is further configured to determine whether to transmit a communication signal including an instruction indicating the normal operation mode or transmit a communication signal including an instruction indicating the security mode, based on a detected operation state of the distributed power generation system. The second detecting module may be connected to a device or a contact other than the SCU in the distributed power generation system, such as the PCU, a photovoltaic inverter, a direct current cable, an alternating current grid or the ground. The operation state of the distributed power generation system includes a grid-connected condition, a safety condition, operation states of other devices in the distributed power generation system, environment of the distributed power generation system, an electrical parameter or instructions inputted from the external.

The second detecting module of the ACU may be configured to detect the grid-connected condition of the distributed power generation system. When detecting that a grid does not satisfy the grid-connected condition of the distributed power generation system, for example, when detecting an over voltage, a under voltage, an islanding situation, an over frequency or a under frequency of the grid, the ACU may transmit the communication signal including an instruction indicating the security mode to all of the multiple PCUs. When detecting that a voltage and a frequency of the grid satisfies the grid-connected condition of the distributed power generation system, the ACU may transmit the communication signal including an instruction indicating the normal operation mode to all of the multiple PCUs.

The second detecting module of the ACU may be configured to detect the safety condition of the distributed power generation system. When detecting that the distributed power generation system does not satisfy the safety standard, for example, when detecting an insulation resistance of a photovoltaic array excesses the standard, a leakage current excesses the standard or a direct current arc occurs, the ACU may transmit the communication signal including an instruction indicating the security mode to all of the multiple PCUs. When detecting that the distributed power generation system satisfies the safety standard, the ACU may transmit the communication signal including an instruction indicating the normal operation mode to all of the multiple PCUs.

The second detecting module of the ACU may be configured to detect operation states of other devices in the distributed power generation system. When detecting that a failure occurs in the other devices in the distributed power generation system, for example, when detecting a failure in the photovoltaic inverter, a failure in a grid-connected box, a failure in one of the multiple PCUs, a failure in an external communication circuit, the ACU may transmit the communication signal including an instruction indicating the security mode to all of the multiple PCUs. When detecting that the other devices in the distributed power generation system operate normally, the ACU may transmit the communication signal including an instruction indicating the normal operation mode to all of the multiple PCUs. Further, when detecting a failure in one of the multiple PCUs, the ACU may control only the failed PCU to operate in the security mode.

The second detecting module of the ACU may be configured to detect the environment of the distributed power generation system. When detecting that the distributed power generation system is located in environment unsuitable for operating, for example, when detecting an ambient temperature is too high or low, an ambient pressure is too high or low, an ambient humidity is too high, the distributed power generation system is soaked in water, a fire occurs, a fire alert is generated or combustible gas leaks, the ACU may transmit the communication signal including an instruction indicating the security mode to all of the multiple PCUs. When detecting that the distributed power generation system is located in environment suitable for operating, the ACU may transmit the communication signal including an instruction indicating the normal operation mode to all of the multiple PCUs.

The second detecting module of the ACU may be configured to detect whether an electrical parameter of the distributed power generation system exceeds a preset threshold. When detecting that the electrical parameter exceeds the preset threshold, for example, when detecting a direct current voltage value exceeds a preset threshold, the ACU may transmit the communication signal including an instruction indicating the security mode to some of the multiple PCUs, so as to decrease the electrical parameter exceeding the preset threshold, thereby increasing reliability and life span of the distributed power generation system.

The second detecting module of the ACU may be configured to detect an instruction inputted from the external to the distributed power generation system. When detecting an instruction inputted from the external, for example, when detecting an instruction inputted through a dry contact, a switch, a push-button, a touch screen, or an external communication interface, the ACU may transmit a communication signal including the instructions inputted from the external to the PCUs, so as to control the shutdown circuits corresponding to the PCUs to operate in a mode corresponding to the instructions inputted from the external.

Sixth Control Logic

In a sixth control logic, the SCU is configured to periodically transmit the first communication signal until receiving the first user command.

The ACU is configured to periodically transmit the second communication signal until receiving the first user command.

Accordingly, each of the multiple PCUs is configured to determine whether the PCU receives one of the first communication signal and the second communication signal during a preset time period. If it is determined that the PCU receives one of the first communication signal and the second communication signal during the preset time period, the PCU is configured to control the shutdown circuit corresponding to the PCU to operate in the normal operation mode. If it is determined that the PCU does not receive any one of the first communication signal and the second communication signal during the preset time period, the PCU is configured to control the shutdown circuit corresponding to the PCU to operate in the security mode.

In the sixth control logic, the SCU and the ACU function as host devices in parallel. Multiple communication links are provided in the sixth control logic, to prevent the shutdown circuit from wrongly operating in the security mode in a case that a single communication link is used and disconnected due to the poor communication, thereby improving the usability of the distributed power generation system compared with the case of a single host device.

In a case that the SCU and each of the ACUs transmits the communication signal at a same communication interval, the SCU and each of the ACUs may monitor a communication state at the communication interval and transmits a signal in an idle communication state, to avoid the communication collision between the SCU and the ACUs.

Alternatively, the SCU and each of the ACUs transmit the signals to the PCU at different communication intervals, which may be implemented by the exemplary methods as described below with an example that the distributed power generation system includes one ACU and one SCU.

In a first method, the SCU and the ACU transmit the signals of different phases. For example, each of the SCU and the ACU transmits the signal regularly at a time interval of 1 s. The SCU starts to transmit the communication signal at a time instant of 0 s, while the ACU starts to transmit the communication signal at a time instant of 0.5 s, such that there is a phase difference of 180 degree, so as to avoid the communication collision.

In a second method, the SCU and the ACU transmit the signals in different cycles. For example, the SCU transmits the communication signal in a cycle of 1 s, while the ACU transmits the communication signal in a cycle of 0.1 s, so as to avoid the communication collision.

In a third method, the SCU and the ACU transmit the signals at different baud rates. For example, the SCU transmits the communication signal at a baud rate of 9600 bps, while the ACU transmits the communication signal at a baud rate of 2400 bps. Communication signals transmitted at different baud rates have different lengths. The PCU can recognize the source of the communication signal and determine whether the communication signal is normal based on the baud rate at which the communication signal is transmitted.

In a fourth method, the SCU and the ACU transmit the signals at different carrier frequencies. For example, the SCU transmits the communication signal at a carrier frequency of 130 kHz, while the ACU transmits the communication signal at a carrier frequency of 140 kHz. In a case that the SCU and the ACU transmit the signals at different carrier frequencies, the PCU can correctly recognize and distinguish the signals even if the SCU and the ACU transmit the signals simultaneously, avoiding the communication collision and unrecognizable signal due to waveform overlap.

In a fifth method, the SCU and the ACU transmit the signals via different channels. For example, there are nine channels 1 to 9 in a communication network. The SCU transmits the communication signal via the channel 1, while the ACU transmits the communication signal via the channel 9, so as to avoid the communication collision. Generally, the channels are divided based on frequency bands. Therefore, some channels may be partially overlapped in frequency bands, resulting in communication collision. As a result, a far distance between two channels (for example, the channel 1 and the channel 9) leads to a low probability of the communication collision.

In a sixth method, the SCU and the ACU transmit the signals in different modulation modes. For example, for the PLC communication, the SCU transmits the communication signal in a modulation mode of frequency-shift keying (FSK), while the ACU transmits the communication signal in a modulation mode of phase-shift keying (PSK). Different modulation modes require different demodulation modes. The PCU can recognize the source of the communication signal and determine whether the communication signal is normal based on the modulation mode.

In a seventh method, the SCU and the ACU transmit the signals by using different protocols. For example, the SCU transmits the communication signal by using a standard Modbus protocol, while the ACU transmits the communication signal by using a user-defined non-Modbus protocol. The PCU supports the protocols used by the SCU and the ACU, and analyze the communication signals by using a corresponding protocol, to recognize the source of the communication signal and determine whether the communication signal is normal.

In an eighth method, the SCU and the ACU transmit the signals though different transmission medium. For example, the SCU transmits the communication signal through wireless communication, that is, the air is used as the medium for transmitting the communication signal. The ACU transmits the communication signal though the PLC communication, that is, a power line is used as the medium for transmitting the communication signal. The PCU is provided with corresponding circuits for receiving communication signals from the different transmission medium. Through the different medium, the communication signal transmitted from the SCU may be physically separated from the communication signal transmitted from the ACU, thereby avoiding the communication collision. There may be other medium, for example, the SCU transmits the communication signal through a voltage signal, while the ACU transmits the communication signal though a current signal.

Seventh Control Logic

In a seventh control logic, the SCU is configured to transmit a communication signal including an instruction indicating the normal operation mode in response to a second user command, and transmit a communication signal including an instruction indicating the security mode in response to a first user command.

The ACU is configured to transmit a communication signal including an instruction indicating the normal operation mode in response to the second user command, and transmit a communication signal including an instruction indicating the security mode in response to the first user command.

Accordingly, each of the multiple PCUs is configured to control the shutdown circuit corresponding to the PCU to operate in the normal operation mode when receiving the communication signal including an instruction indicating the normal operation mode transmitted from one of the SCU and the ACU, and control the shutdown circuit corresponding to the PCU to operate in the security mode when receiving the communication signal including an instruction indicating the security mode transmitted from one of the SCU and the ACU.

In the seventh control logic, the SCU and the ACU function as host devices in parallel. Multiple communication links are provided in the seventh control logic, to prevent the shutdown circuit from wrongly operating in the security mode in a case that a single communication link is used and disconnected due to the poor communication, thereby improving the usability of the distributed power generation system compared with the case of single host device. In the seventh control logic, the communication collision between the SCU and the ACUs can be avoided by using the methods as described in the sixth control logic.

Corresponding to the above embodiments of the shutdown control system, a shutdown control method is further provided according to embodiments of the present disclosure. The shutdown control method is applied to the shutdown control system. The shutdown control system includes a main circuit and a control circuit. The main circuit is a series circuit formed by connecting output ends of multiple shutdown circuits in series. Alternatively, the main circuit is a series-parallel circuit formed by connecting output ends of multiple shutdown circuits in series to form a series circuit and connecting output ends of multiple such series circuits in parallel. An input end of each of the multiple shutdown circuits is connected to at least one of direct current power supplies in a distributed power generation system.

The control circuit includes a SCU, one or more ACUs, and multiple PCUs corresponding to the multiple shutdown circuits.

Figure 3:
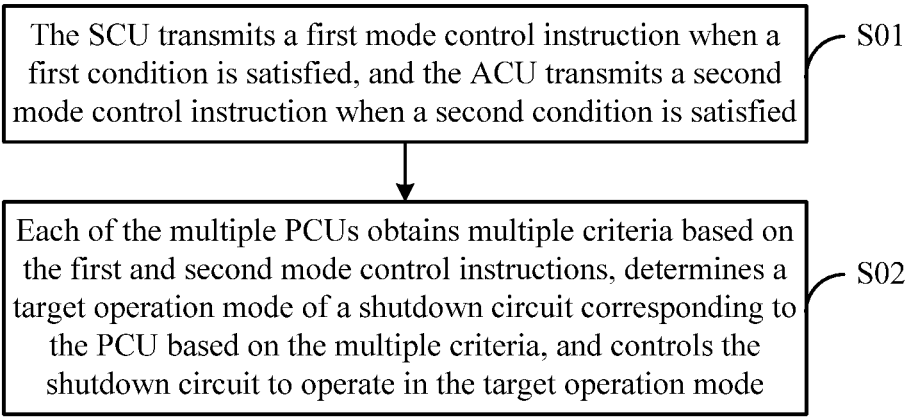
FIG. 3 is a flowchart of a shutdown control method according to an embodiment of the present disclosure.

Referring to FIG. 3, the shutdown control method includes the following steps S01 to S02.

In step S01, The SCU transmits a first mode control instruction when a first condition is satisfied, and the ACU transmits a second mode control instruction when a second condition is satisfied.

In step S02, each of the multiple PCUs obtains multiple criteria based on the first and second mode control instructions, determines a target operation mode of a shutdown circuit corresponding to the PCU based on the multiple criteria, and controls the shutdown circuit to operate in the target operation mode.

The target operation mode includes a security mode and a normal operation mode. In the security mode, an output voltage of the shutdown circuit corresponding to the PCU is limited, such that an output voltage of the series circuit falls within a security voltage range. The normal operation mode is a mode other than the security mode.

The embodiments in this specification are described in a progressive way, each of which emphasizes the differences from others, and the same or similar parts among the embodiments can be referred to each other. Since the disclosed shutdown control method corresponds to the disclosed shutdown control system, the description thereof is relatively simple, and for specific control logics involved in the shutdown control method, references may be made to the description of the shutdown control system.

The description of the embodiments disclosed above enables those skilled in the art to implement or use the present disclosure. Numerous modifications to the embodiments are apparent to those skilled in the art, and the general principles defined herein can be implemented in other embodiments without deviating from the spirit or scope of the present disclosure. Therefore, the present disclosure may not be limited to the embodiments described herein, but is in accordance with the widest scope consistent with the principles and novel features disclosed herein.

The invention claimed is:

1. A shutdown control system, comprising:
a main circuit being a series circuit formed by connecting output ends of a plurality of shutdown circuits in series, or a series-parallel circuit formed by connecting output ends of a plurality of shutdown circuits in series to form a series circuit and connecting output ends of a plurality of the series circuits in parallel, wherein an input end of each of the plurality of shutdown circuits is connected to at least one of direct current power supplies in a distributed power generation system; and
a control circuit comprising a system control unit (SCU), one or more auxiliary control units (ACU), and a plurality of power source control units (PCU) corresponding to the plurality of shutdown circuits, wherein
the SCU is configured to transmit a first mode control instruction when a first condition is satisfied, and each of the ACUs is configured to transmit a second mode control instruction when a second condition is satisfied;
each of the plurality of PCUs is configured to obtain a plurality of criteria based on the first mode control instruction and the second mode control instruction, determine a target operation mode of a shutdown circuit corresponding to the PCU based on the plurality of criteria, and control the shutdown circuit corresponding to the PCU to operate in the target operation mode; and
the target operation mode comprises a security mode and a normal operation mode being a mode other than the security mode, and in the security mode, an output voltage of the shutdown circuit corresponding to the PCU is limited to control an output voltage of the series circuit to be in a security voltage range.

2. The shutdown control system according to claim 1, wherein
the SCU is configured to periodically transmit a first communication signal as the first mode control instruction, and stop transmitting the first communication signal when receiving a first user command;

each of the ACUs is configured to periodically transmit a second communication signal as the second mode control instruction while detecting that the SCU periodically transmits the first communication signal, and stop transmitting the second communication signal when detecting that the SCU stops transmitting the first communication signal; and each of the plurality of PCUs is configured to determine whether the PCU receives one of the first communication signal from the SCU and the second communication signal from the ACU during a preset time period, control the shutdown circuit corresponding to the PCU to operate in the normal operation mode if it is determined that the PCU receives one of the first communication signal from the SCU and the second communication signal from the ACU during the preset time period, and control the shutdown circuit corresponding to the PCU to operate in the security mode if it is determined that the PCU does not receive any one of the first communication signal from the SCU and the second communication signal from the ACU during the preset time period.

3. The shutdown control system according to claim 2, wherein each of the first communication signal and the second communication signal is a communication signal comprising an instruction indicating the normal operation mode;

the SCU is further configured to periodically transmit a communication signal comprising an instruction indicating the security mode in response to the first user command; and each of the ACUs is further configured to periodically transmit a communication signal comprising an instruction indicating the security mode after detecting that the SCU stops transmitting the first communication signal.

4. The shutdown control system according to claim 1, wherein the SCU is configured to transmit a communication signal comprising an instruction indicating the normal operation mode in response to a second user command, and transmit a communication signal comprising an instruction indicating the security mode in response to a first user command, wherein each of the communication signal comprising the instruction indicating the normal operation mode and the communication signal comprising the instruction indicating the security mode functions as the first mode control instruction;

each of the ACUs is configured to transmit a communication signal comprising an instruction indicating the normal operation mode or an instruction indicating the security mode following the SCU; and each of the plurality of PCUs is configured to control the shutdown circuit corresponding to the PCU to operate in the normal operation mode when receiving the communication signal comprising the instruction indicating the normal operation mode transmitted from one of the SCU and the ACUs, and control the shutdown circuit corresponding to the PCU to operate in the security mode when receiving the communication signal comprising the instruction indicating the security mode transmitted from one of the SCU and the ACUs.

5. The shutdown control system according to claim 1, wherein the SCU is configured to periodically transmit a first communication signal as the first mode control instruction, and stop transmitting the first communication signal when receiving a first user command;

each of the ACUs is configured to periodically transmit a communication signal comprising an instruction indicating the normal operation mode while detecting that the SCU periodically transmits the first communication signal, and periodically transmit a communication signal comprising an instruction indicating the security mode when detecting that the SCU stops transmitting the first communication signal, wherein each of the communication signal comprising the instruction indicating the normal operation mode and the communication signal comprising the instruction indicating the security mode functions as the second mode control instruction; and each of the plurality of PCUs is configured to control the shutdown circuit corresponding to the PCU to operate in the security mode if one of a third condition and a fourth condition is satisfied, and control the shutdown circuit corresponding to the PCU to operate in the normal operation mode if none of the third condition and the fourth condition is satisfied, wherein the third condition is that the PCU neither receives the first communication signal from the SCU nor receives the communication signal comprising the instruction indicating the normal operation mode from any of the ACUs during a preset time period, and the fourth condition is that the PCU receives the communication signal comprising the instruction indicating the security mode from one of the ACUs.

6. The shutdown control system according to claim 2, wherein in the shutdown control system, each of the ACUs is integrated into one of the plurality of PCUs, and each of the plurality of PCUs is integrated with one of the ACUs.

7. The shutdown control system according to claim 1, wherein the SCU is configured to periodically transmit a first communication signal as the first mode control instruction, and stop transmitting the first communication signal when receiving a first user command;

at least one of the ACUs is configured to take over from the SCU when detecting that a failure occurs in the SCU; and each of the plurality of PCUs is configured to determine whether the PCU receives the first communication signal from one of the SCU and the ACUs during a preset time period, control the shutdown circuit corresponding to the PCU to operate in the normal operation mode if it is determined that the PCU receives the first communication signal from one of the SCU and the ACUs during the preset time period, and control the shutdown circuit corresponding to the PCU to operate in the security mode if it is determined that the PCU does not receive the first communication signal from any one of the SCU and the ACUs during the preset time period.

8. The shutdown control system according to claim 1, wherein the SCU is configured to transmit a communication signal comprising an instruction indicating the normal operation mode in response to a second user command, and transmit a communication signal comprising an instruction indicating the security mode in response to a first user command, wherein each of the communication signal comprising the instruction indicating the normal operation mode and the communication signal comprising the instruction indicating the security mode functions as the first mode control instruction;

at least one of the ACUs is configured to take over from the SCU when detecting that a failure occurs in the SCU; and each of the plurality of PCUs is configured to control the shutdown circuit corresponding to the PCU to operate in the normal operation mode when receiving the communication signal comprising the instruction indicating the normal operation mode transmitted from one of the SCU and the ACUs, and control the shutdown circuit corresponding to the PCU to operate in the security mode when receiving the communication signal comprising the instruction indicating the security mode transmitted from one of the SCU and the ACUs.

9. The shutdown control system according to claim 1, wherein the SCU is configured to periodically transmit a first communication signal as the first mode control instruction, and stop transmitting the first communication signal when receiving a first user command;

each of the ACUs is configured to periodically transmit a second communication signal, and stop transmitting the second communication signal when receiving the first user command; and each of the plurality of PCUs is configured to determine whether the PCU receives one of the first communication signal and the second communication signal during a preset time period, control the shutdown circuit corresponding to the PCU to operate in the normal operation mode if determining that the PCU receives one of the first communication signal and the second communication signal during the preset time period, and control the shutdown circuit corresponding to the PCU to operate in the security mode if determining that the PCU receives neither the first communication signal nor the second communication signal during the preset time period.

10. The shutdown control system according to claim 1, wherein the SCU is configured to transmit a communication signal comprising an instruction indicating the normal operation mode as the first mode control instruction in response to a second user command, and transmit a communication signal comprising an instruction indicating the security mode as the first mode control instruction in response to a first user command;

each of the ACUs is configured to transmit a communication signal comprising an instruction indicating the normal operation mode as the second mode control instruction in response to the second user command, and transmit a communication signal comprising an instruction indicating the security mode as the second mode control instruction in response to the first user command; and each of the plurality of PCUs is configured to control the shutdown circuit corresponding to the PCU to operate in the normal operation mode when receiving the communication signal comprising the instruction indicating the normal operation mode transmitted from one of the SCU and the ACUs, and control the shutdown circuit corresponding to the PCU to operate in the security mode when receiving the communication signal comprising the instruction indicating the security mode transmitted from one of the SCU and the ACUs.

11. A shutdown control method, applied to a shutdown control system comprising a main circuit and a control circuit, wherein the main circuit is a series circuit formed by connecting output ends of a plurality of shutdown circuits in series or a series-parallel circuit formed by connecting output ends of a plurality of shutdown circuits in series to form a series circuit and connecting output ends of a plurality of the series circuits in parallel, wherein an input end of each of the plurality of shutdown circuits is connected to at least one of direct current power supplies in a distributed power generation system; and the control circuit comprises a system control unit (SCU), one or more auxiliary control units (ACUs), and a plurality of power source control units (PCU) corresponding to the plurality of shutdown circuits, and wherein the method comprises:

transmitting, by the SCU, a first mode control instruction when a first condition is satisfied;

transmitting, by each of the ACUs, a second mode control instruction when a second condition is satisfied; and obtaining, by each of the plurality of PCUs, a plurality of criteria based on the first mode control instruction and the second mode control instruction, determining, by the PCU, a target operation mode of a shutdown circuit corresponding to the PCU based on the plurality of criteria, and controlling, by the PCU, the shutdown circuit corresponding to the PCU to operate in the target operation mode, wherein the target operation mode comprises a security mode and a normal operation mode being a mode other than the security mode, and in the security mode, an output voltage of the shutdown circuit corresponding to the PCU is limited to control an output voltage of the series circuit to be in a security voltage range.

* * * * *